(12) United States Patent
Takasu et al.

(10) Patent No.: US 10,350,725 B2
(45) Date of Patent: Jul. 16, 2019

(54) RAMO4 SUBSTRATE AND MANUFACTURING METHOD THEREOF

(71) Applicant: Panasonic Intellectual Property Management Co., Ltd., Osaka (JP)

(72) Inventors: Yoshifumi Takasu, Osaka (JP); Yoshio Okayama, Osaka (JP); Akihiko Ishibashi, Osaka (JP); Isao Tashiro, Osaka (JP); Akio Ueta, Hyogo (JP); Masaki Nobuoka, Nara (JP); Naoya Ryoki, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 120 days.

(21) Appl. No.: 15/424,529

(22) Filed: Feb. 3, 2017

(65) Prior Publication Data

US 2017/0239779 A1    Aug. 24, 2017

(30) Foreign Application Priority Data

Feb. 23, 2016  (JP) ................................. 2016-032344
Nov. 8, 2016   (JP) ................................. 2016-218195

(51) Int. Cl.
*C30B 33/00*     (2006.01)
*C30B 29/26*     (2006.01)
(Continued)

(52) U.S. Cl.
CPC ............ *B24B 37/042* (2013.01); *B24B 7/228* (2013.01); *B28D 5/00* (2013.01); *C01F 17/0025* (2013.01);
(Continued)

(58) Field of Classification Search
CPC ....... B24B 37/042; B24B 7/228; C30B 29/26; C30B 33/00; C30B 29/22; B28D 5/00;
(Continued)

(56) References Cited

U.S. PATENT DOCUMENTS

2006/0236922 A1   10/2006  Ishibashi et al.
2010/0133470 A1*  6/2010   Nakahara ................ C30B 29/16
                                                        252/301.6 R
(Continued)

FOREIGN PATENT DOCUMENTS

JP    2010-047463 A    3/2010
JP    2015-178448      10/2015

*Primary Examiner* — Nathan L Van Sell

(74) *Attorney, Agent, or Firm* — McDermott Will & Emery LLP

(57) ABSTRACT

A $RAMO_4$ substrate is formed from single crystal represented by a formula of $RAMO_4$ (in the formula, R indicates one or a plurality of trivalent elements selected from a group consisting of Sc, In, Y, and a lanthanoid element, A indicates one or a plurality of trivalent elements selected from a group consisting of Fe(III), Ga, and Al, and M indicates one or a plurality of bivalent elements selected form a group consisting of Hg, Mn, Fe(II), Co, Cu, Zn, and Cd). An epitaxially-grown surface is provided on at least one surface of the $RAMO_4$ substrate. The epitaxially-grown surface includes a plurality of cleavage surfaces which are regularly distributed, and are separated from each other.

10 Claims, 16 Drawing Sheets

(51) Int. Cl.
  *C30B 29/22*  (2006.01)
  *H01L 33/00*  (2010.01)
  *C01F 17/00*  (2006.01)
  *B28D 5/00*  (2006.01)
  *B24B 7/22*  (2006.01)
  *B24B 37/04*  (2012.01)

(52) U.S. Cl.
  CPC .............. *C30B 29/22* (2013.01); *C30B 29/26* (2013.01); *C30B 33/00* (2013.01); *H01L 33/007* (2013.01); *H01L 33/0066* (2013.01)

(58) Field of Classification Search
  CPC . C01F 17/0025; H01L 33/007; H01L 33/0066
  See application file for complete search history.

(56) References Cited

U.S. PATENT DOCUMENTS

| | | | | |
|---|---|---|---|---|
| 2012/0015143 A1* | 1/2012 | Chyan | ................... | B82Y 30/00 428/141 |
| 2012/0112158 A1* | 5/2012 | Chyan | ................... | C30B 25/186 257/13 |
| 2014/0220301 A1* | 8/2014 | Chyan | ................... | B82Y 30/00 428/141 |

* cited by examiner

PRIOR ART

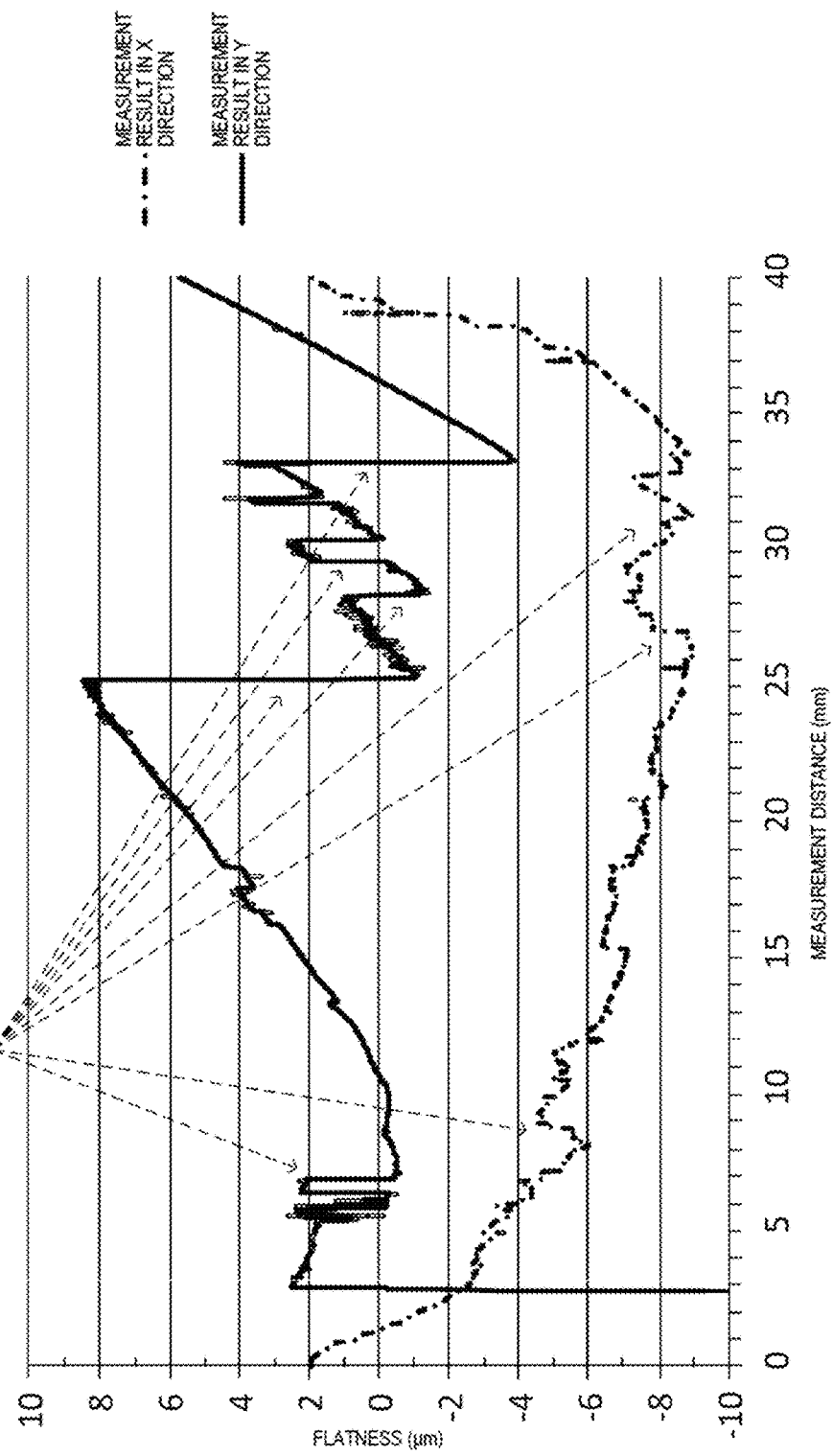

FIG. 14
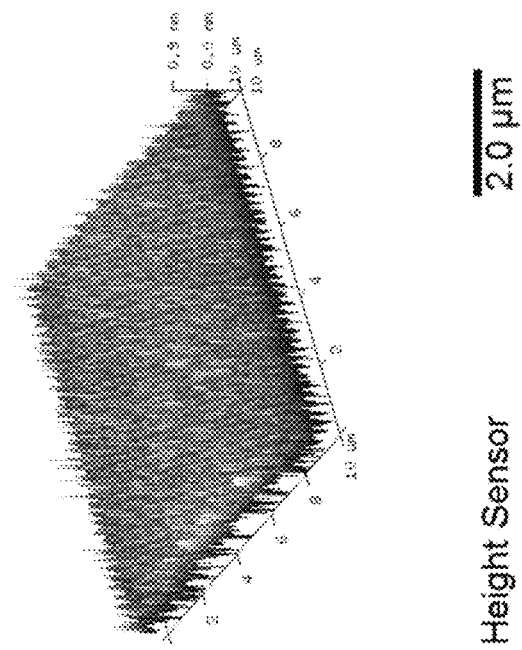
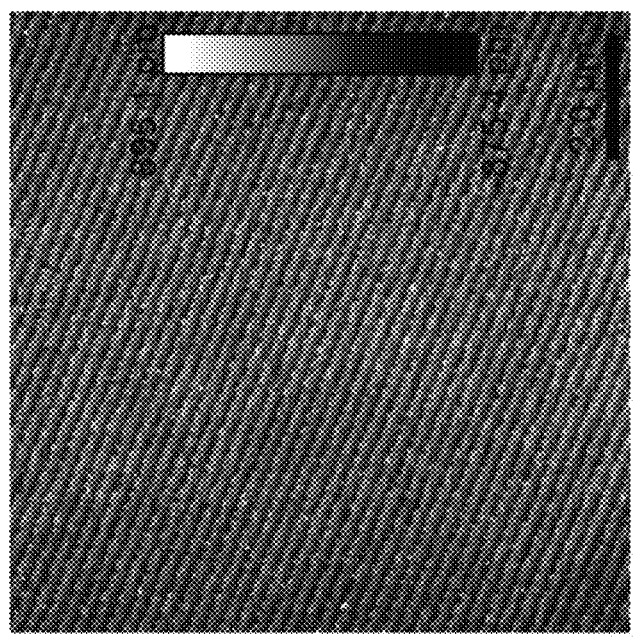
Height Sensor 2.0 μm
Height Sensor
SURFACE ROUGHNESS
· · · · Rq         0.269 nm
– – – Ra         0.207 nm
- - - Roughness Rmax   9.41 nm

RAMO4 SUBSTRATE AND MANUFACTURING METHOD THEREOF

TECHNICAL FIELD

The technical field relates to a $RAMO_4$ substrate and a manufacturing method thereof.

BACKGROUND

A $RAMO_4$ substrate is formed from single crystal represented by a formula of $RAMO_4$ (in the formula, R indicates one or a plurality of trivalent elements selected from a group consisting of Sc, In, Y, and a lanthanoid element, A indicates one or a plurality of trivalent elements selected from a group consisting of Fe(III), Ga, and Al, and M indicates one or a plurality of bivalent elements selected from a group consisting of Mg, Mn, Fe(II), Co, Cu, Zn, and Cd). As one of such a $RAMO_4$ substrate, a $ScAlMgO_4$ substrate is known. A $ScAlMgO_4$ substrate is used as a substrate for growing nitride semiconductor such as GaN (see Japanese Patent Unexamined Publication No. 2015-178448, for example). FIG. 1 illustrates an example of a manufacturing method of a conventional $ScAlMgO_4$ substrate disclosed in Japanese Patent Unexamined Publication No. 2015-178448. As illustrated in FIG. 1, the conventional $ScAlMgO_4$ substrate is manufactured by cleaving a $ScAlMgO_4$ bulk material.

SUMMARY

However, it is difficult to obtain a $RAMO_4$ substrate having a desired surface shape, only by cleaving. Further, a substrate having higher quality is required. That is, an object of the disclosure is to provide a substrate having higher quality.

To solve the above object, as well as other concerns, according to the disclosure, a $RAMO_4$ substrate comprises a single crystal represented by a formula of $RAMO_4$ (in the formula, R indicates one or a plurality of trivalent elements selected from a group consisting of Sc, In, Y, and a lanthanoid element, A indicates one or a plurality of trivalent elements selected from a group consisting of Fe(III), Ga, and Al, and M indicates one or a plurality of bivalent elements selected front a group consisting of Mg, Mn, Fe(II), Co, Cu, Zn, and Cd). An epitaxially-grown surface is provided on at least one surface of the $RAMO_4$ substrate. The epitaxially-grown surface includes a plurality of cleavage surfaces which are regularly distributed, and are separated from each other.

According to the disclosure, it is possible to provide a $RAMO_4$ substrate having higher quality.

BRIEF DESCRIPTION OF THE DRAWINGS

FIG. 3 is a diagram illustrating a result obtained by measuring flatness of a conventional epitaxially-grown surface which is formed only by cleaving.

FIG. 14 is a diagram illustrating a result obtained by performing AFM measurement of the $ScAlMgO_4$ substrate according to the embodiment in the disclosure.

DESCRIPTION OF EMBODIMENTS

Hereinafter, an embodiment of the disclosure will be described with reference to the drawings.

Firstly, knowledge leading to the disclosure will be described. As described in Patent Literature 1, in the related art, a $ScAlMgO_4$ substrate is manufactured by cleaving a $ScAlMgO_4$ bulk material. However, a step having a height of 500 nm or more is easily formed on an epitaxially-grown surface for growing GaN on the $ScAlMgO_4$ substrate, only by performing cleavage. If a step portion having a height of 500 nm or more is provided on the epitaxially-grown surface, inconvenience occurs when crystal is caused to epitaxially grow on the substrate. A disadvantage in a case where a step having a height of 500 nm or more is provided on the epitaxially-grown surface of the substrate will be described. If crystal such as GaN is produced on an epitaxially-grown surface in which a step having a height of 500 nm or more is provided, a crystal orientation at the step portion having a height of 500 nm or more, is different from a crystal orientation at other portions. For example, if an InGaN layer used for an LED light emission layer is formed on an epitaxially-grown surface by a metal-organic chemical vapor deposition (HOCVD) method, the composition of indium at the step portion is different from that at a flat portion. If the composition of indium varies, emitted light wavelength and brightness when being used as an LED element are changed. As a result, light emission irregularity when being used as an LED element occurs, and deterioration of brightness is caused.

Figure 1:
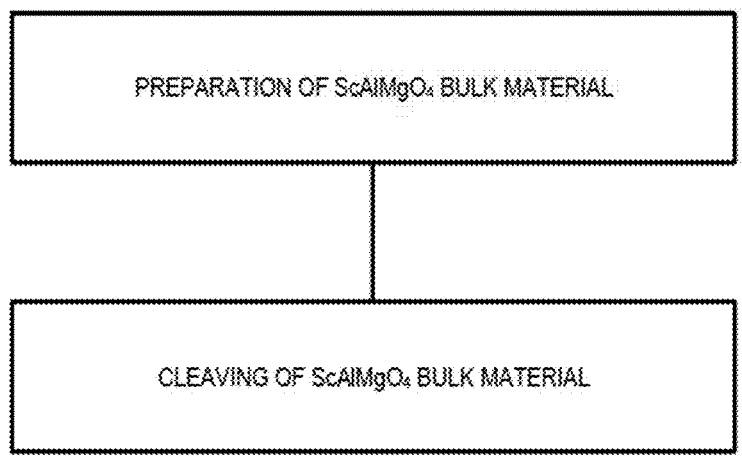
FIG. 1 is a diagram illustrating a manufacturing processing of a conventional $ScAlMgO_4$ substrate.
Figure 2A:
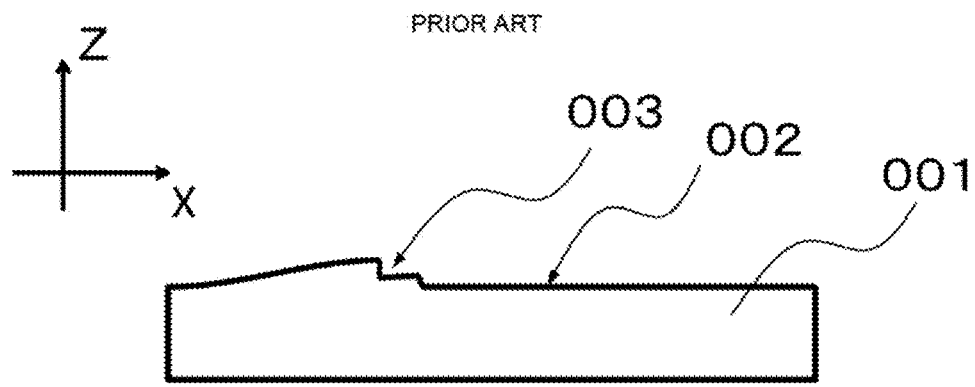
FIG. 2A is a side view illustrating the conventional $ScAlMgO_4$ substrate.
Figure 2B:
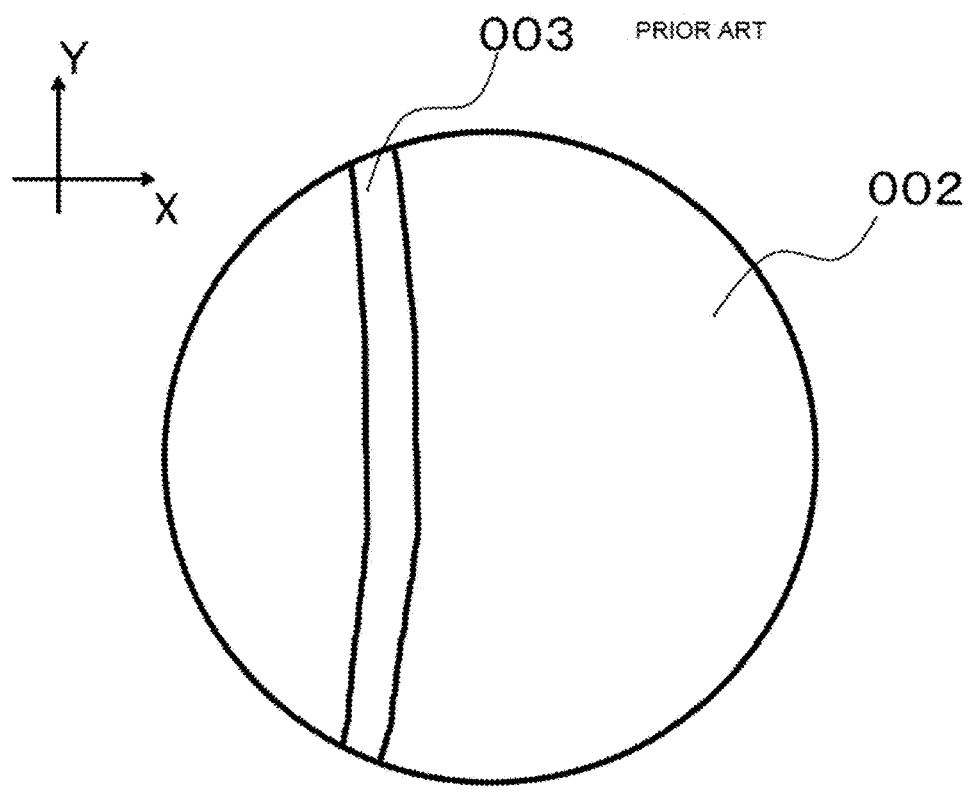
FIG. 2B is a plan view illustrating the conventional $ScAlMgO_4$ substrate.

Next, details and problems of a conventional ScAlMgO$_4$ substrate in which a step having a height of 500 nm or more is provided will be described. FIG. 2A is a side view illustrating conventional ScAlMgO$_4$ substrate 001. FIG. 2B is a plan view illustrating substrate 001. As illustrated in FIGS. 2A and 2B, step portion 003 is formed on epitaxially-grown surface 002 of ScAlMgO$_4$ substrate 001. Here, the height of step portion 003 is equal to or more than 500 nm. FIG. 3 illustrates data obtained by measuring flatness of epitaxially-grown surface 002 of ScAlMgO$_4$ substrate 001 which has been formed by cleaving. The data is obtained in such a manner that ScAlMgO$_4$ substrate 001 of φ40 mm is measured in X and Y axes orthogonal to each other in the same plane, by using a laser reflection type wavelength, measurement device (NH-3MA manufactured by Mitaka Kohki Co., Ltd.). In FIG. 3, a portion indicated by an arrow corresponds to an unevenness portion of 500 nm or higher. It is considered that exfoliation during cleaving occurs in a cleaving direction and the force varies, and thus cleaving in the same atomic layer is not caused, and as a result, an unevenness portion formed from steps of 500 nm or higher occurs in the ScAlMgO$_4$ substrate.

In the disclosure, a manufacturing method including a process of removing the steps having a height of 500 nm or more is provided. In particular, a manufacturing method including a process of forming a plurality of cleavage surfaces which are regularly distributed, and are separated from each other, on an epitaxialiy-grown surface is provided.

Figure 4:
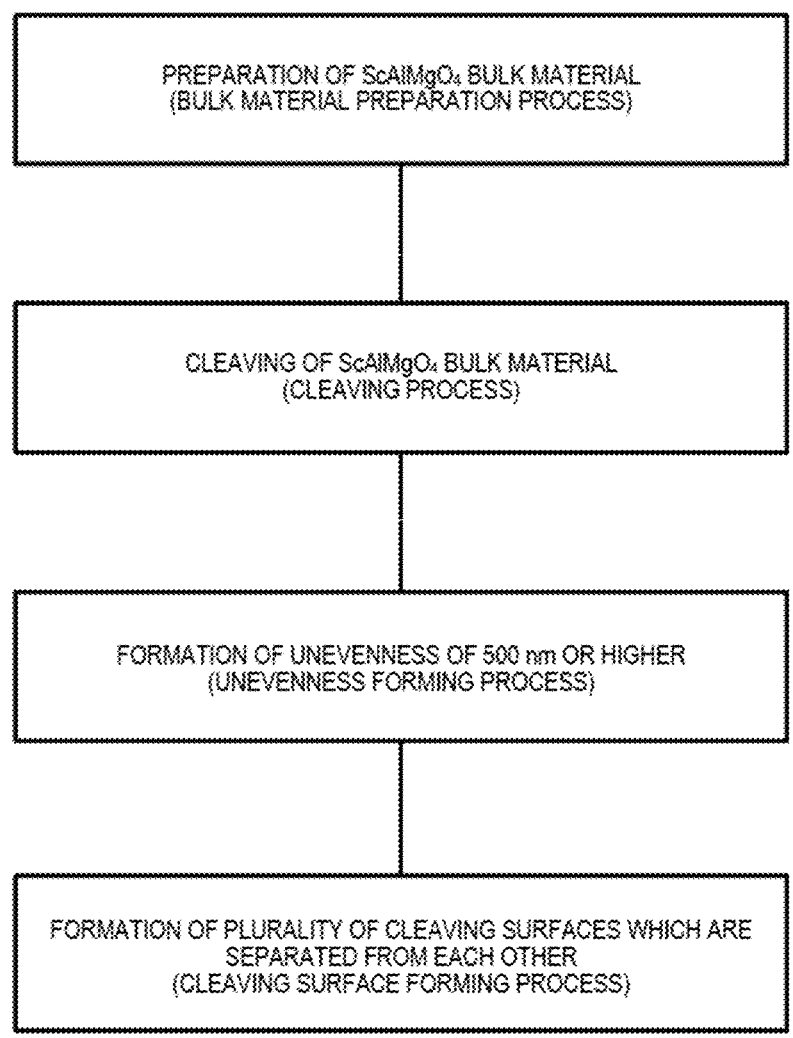
FIG. 4 is a diagram illustrating a manufacturing process of a $ScAlMgO_4$ substrate according to an embodiment of the disclosure.

FIG. 4 illustrates a manufacturing process of the ScAlMgO$_4$ substrate according to the embodiment. The manufacturing method according to the disclosure includes a process of preparing a ScAlMgO$_4$ bulk material (bulk material preparation process), a process of cleaving the prepared bulk material to perform division and form a substrate (cleaving process), and a process of machining a surface corresponding to an epitaxially-grown surface of the substrate (unevenness forming process and cleavage surface forming process).

For example, in the bulk material preparation process, a single crystal ScAlMgO$_4$ ingot manufactured by using a high-frequency induction heating type Czochralski furnace is prepared. As a manufacturing method of the ingot, for example, as a starting material, Sc$_2$O$_3$, Al$_2$O$_3$, and MgO having purity of 4N (99.99%) are mixed with a predetermined molar ratio. 3400 g of the starting material is put into a crucible which is formed of iridium and has a diameter of 100 mm. Then, the crucible into which the raw material has been put is put into a growing furnace of a high-frequency induction heating type Czochralski furnace, and the inside of the furnace is vacuumed. Then, nitrogen is introduced, and heating the crucible is started at a time point when pressure in the furnace reaches the atmospheric pressure. Heating is gradually performed for 12 hours until the temperature of the furnace reaches a melting point of ScAlMgO$_4$, and thus the material is molten. Then, ScAlMgO$_4$ single crystal which has been cut out at the (0001) orientation is used as seed crystal, so as to drop the seed crystal up to the near of a molten liquid in the crucible. The seed crystal is gradually dropped while being rotated at a constant rotation speed. While a tip end of the seed crystal is brought into contact with the molten liquid to gradually lower the temperature, the seed crystal is pulled up (pulled up in a [0001] axis direction) at a speed, that is, a pulling speed of 0.5 mm/h, and thus crystal growth is performed. Thus, a single crystal ingot which has a diameter of 50 mm and a straight body portion having a length of 50 mm is obtained.

Here, ScAlMgO$_4$ single crystal will be described. ScAlMgO$_4$ single crystal has a structure in which a ScO$_2$ layer like a (111) plane having a rocksalt structure, and an AlMgO$_2$ layer like a (0001) plane of hexagonal crystal are alternately stacked. Two layers like the (0001) plane of hexagonal crystal are flat in comparison to a wurtzite structure. Bonding between an upper layer and a lower layer has a length of about 0.03 nm, and a weak force in comparison to in-plane bonding. Thus, the ScAlMgO$_4$ single crystal can be cleaved in the (0001) plane. The process of dividing the bulk material by cleaving, to prepare a plate (cleaving process) may be performed by using the characteristics.

Properties relating to cleaving of the ScAlMgO$_4$ single crystal may cause the cleaving process to be easily performed. In contrast, machining a cleavage surface by a conventional machining method is difficult. That is, in the conventional machining method, removing an unevenness which is formed on the cleavage surface, and has a height of 500 nm or more is not possible. The reason will be described. In descriptions, generally, as an example, a case where machining performed on a semiconductor substrate such as GaN to allow an unevenness on the surface thereof to be less than 500 nm is performed on a ScAlMgO$_4$ substrate will be described. A machining area is set to have 10 mm angle.

Figure 5:
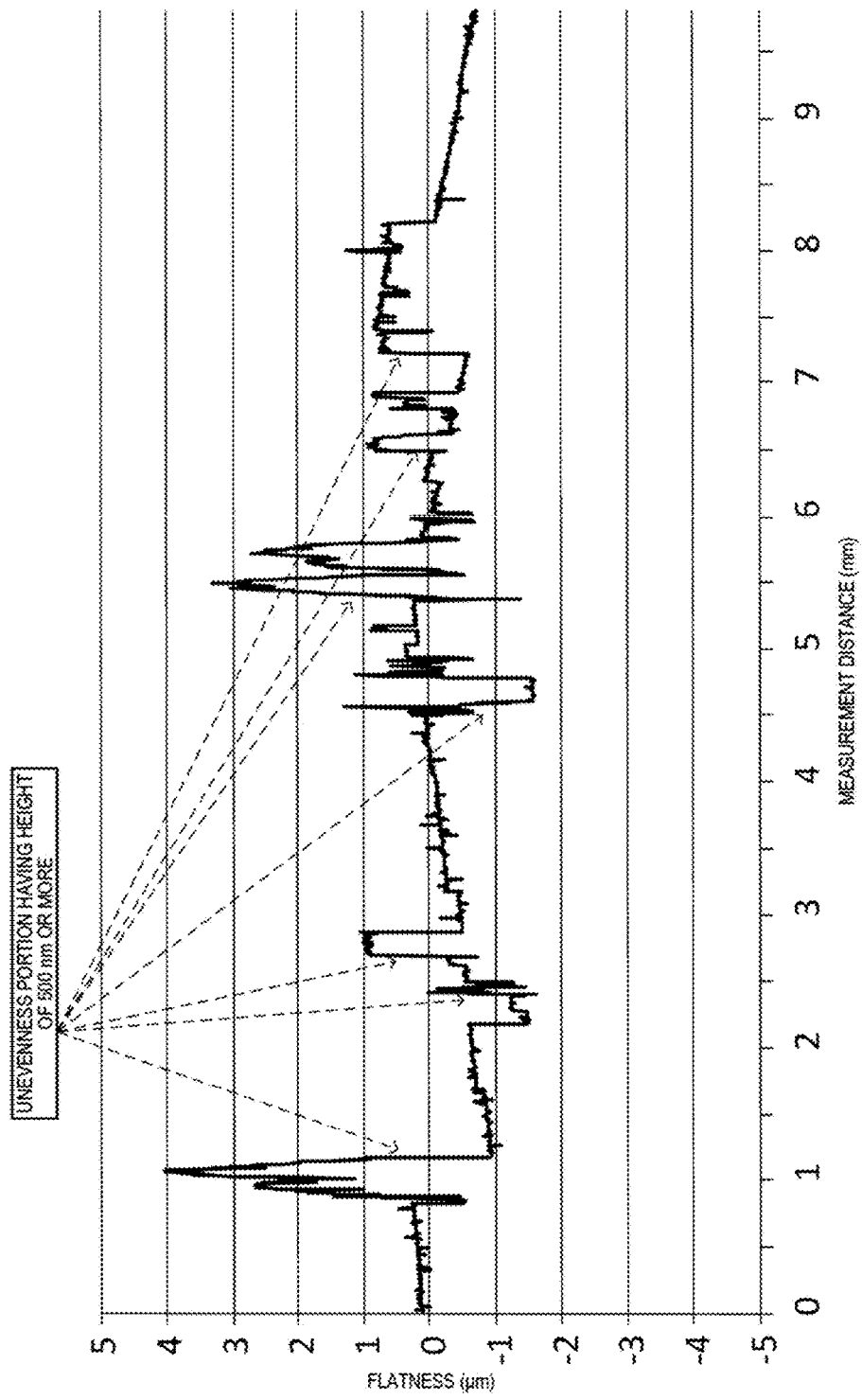
FIG. 5 is a diagram illustrating a result obtained by measuring flatness when a $ScAlMgO_4$ cleavage surface is polished by using diamond slurry of 2 μm.

Firstly, lap polishing is performed on a cleavage surface of ScAlMgO$_4$ by using diamond slurry (abrasive grain). The diamond slurry has a size having a diameter of 2 μm, and is used in conventional coarse polishing. FIG. 5 illustrates a result obtained by lap polishing. FIG. 5 illustrates a result obtained, in such a manner that flatness of a sectional shape of the surface obtained by machining is measured in the X direction by the above-described laser reflection type length measurement device. As illustrated in FIG. 5, it is recognized that, if the machining is performed, an unevenness of 500 nm or higher is formed on the surface. In the lap polishing, the diamond slurry rolls on the surface of ScAlMgO$_4$, and thus the material at a portion at which the diamond slurry rolls is finely removed. However, the single crystal ScAlMgO$_4$ is a stacked body of multiple ScO$_2$ layers and AlMgO$_2$ layers. Thus, it is considered that variation of a machining force causes exfoliation to partially occur at a deep layer. Thus, as illustrated in FIG. 5, it is considered that an unevenness of 500 nm or higher is formed.

Figure 6:
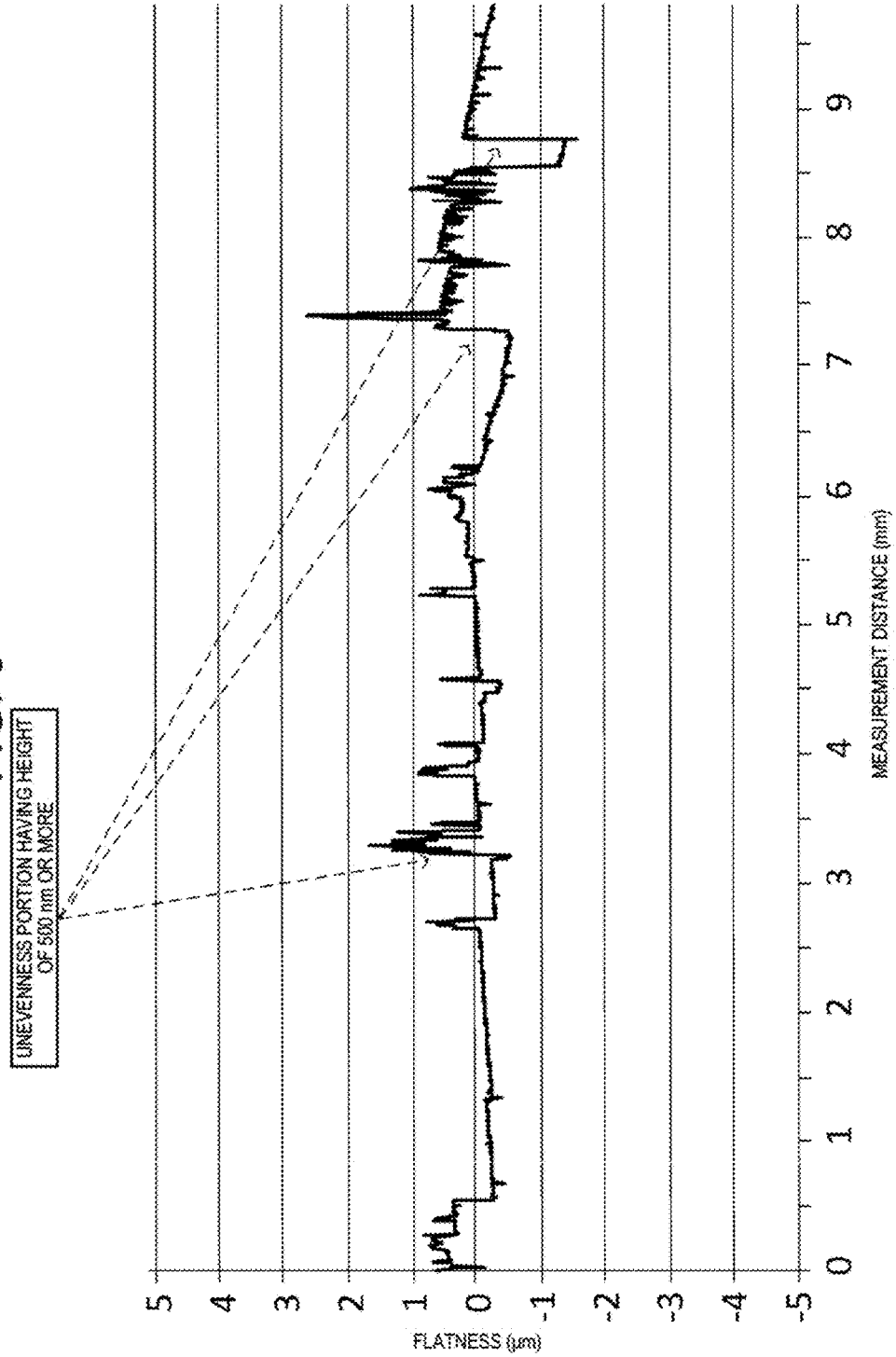
FIG. 6 is a diagram illustrating a result obtained by measuring flatness when a $ScAlMgO_4$ cleavage surface is polished by using diamond slurry of 0.125 μm.

Generally, in order to reduce such variation of a machining force, it is effective to set the size of the abrasive grain to be smaller than the allowable size of the unevenness. FIG. 6 illustrates a result in a case where lap polishing is performed on the cleavage surface of ScAlMgO$_4$ by using diamond slurry which has a size of a diameter of 0.125 μm, as the abrasive grain. At this time, as a method of measuring flatness in the X direction, a method similar to that in a case where polishing is performed by using diamond slurry which has a size of a diameter of 2 μm is applied. As illustrated in FIG. 6, even though the size of the abrasive grain is set to be smaller than the allowable size (500 nm) of the unevenness, the unevenness of 500 nm or higher is formed.

Figure 7:
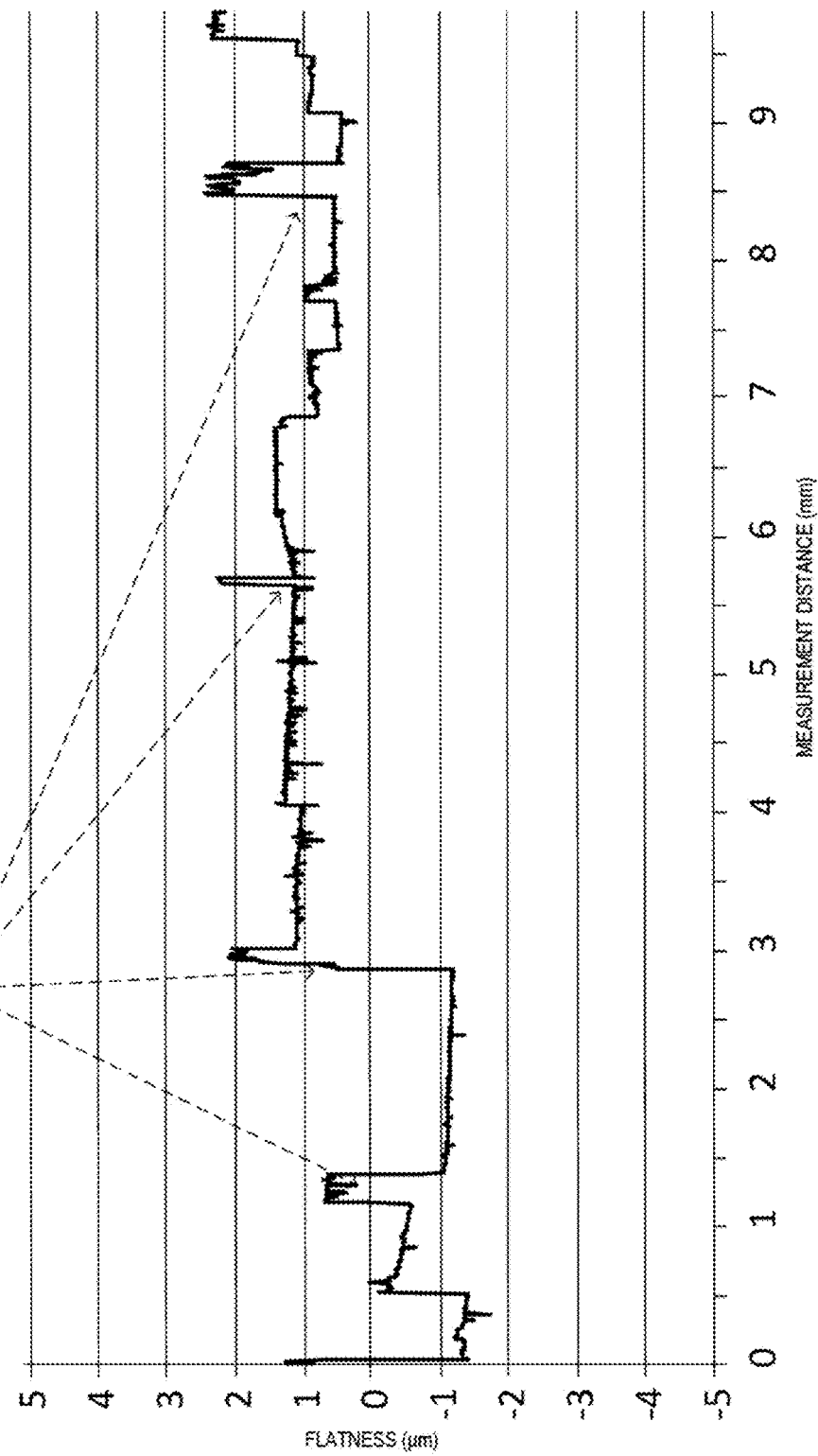
FIG. 7 is a diagram illustrating a result obtained by measuring flatness when a $ScAlMgO_4$ cleavage surface is polished by using colloidal silica.

Hardness or the shape of an abrasive grain in accordance with the type of an abrasive grain has an influence on a surface shape of the polished surface. FIG. 7 illustrates a result obtained by performing polishing with a colloidal silica abrasive grain which is softer and has a shape more approximate to a sphere, than diamond. Polishing is performed with a pressing force of 1000 Pa, when machining GaN single crystal is generally performed. At this time, as a method of measuring flatness in the X direction, a method similar to that in a case where polishing is performed by using diamond slurry which has a size of a diameter of 2 μm is applied. As illustrated in FIG. 7, according to this method, a small unevenness can be removed, but removing an unevenness of 500 nm or higher is not possible.

As described above, even though polishing using any free abrasive grain is performed, causing an unevenness on an epitaxially-grown surface of a ScAlMgO$_4$ substrate to be less than 500 nm is not possible.

Figure 8:
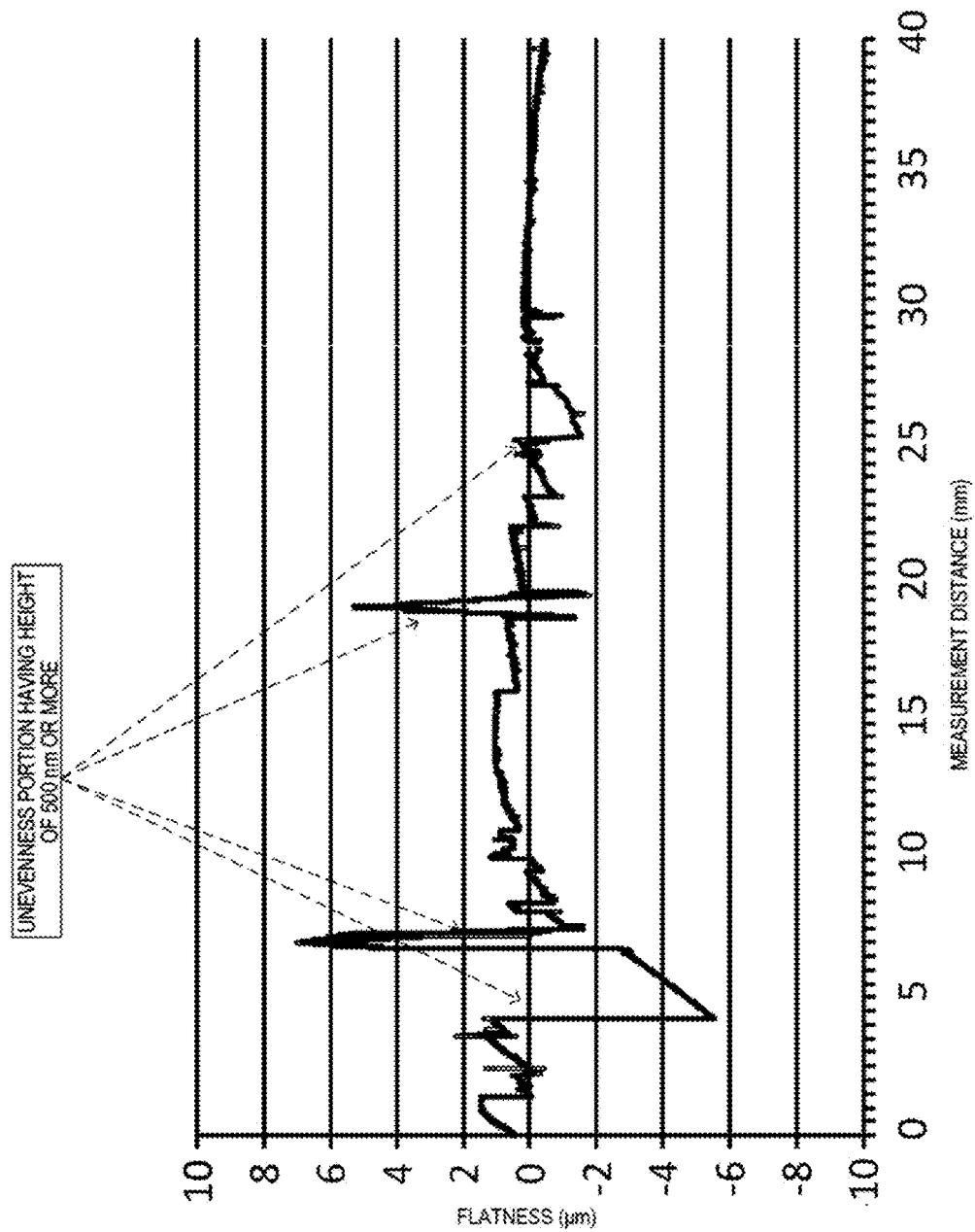
FIG. 8 is a diagram illustrating a result obtained by measuring flatness when a $ScAlMgO_4$ cleavage surface is polished by machining with diamond-fixed abrasive grains of 0.5 μm.

Grinding is performed by using a diamond-fixed abrasive grain which has a size of a diameter of 0.5 μm. FIG. 8 illustrates a result. As a method of measuring flatness in the X direction, a method similar to that in a case where polishing is performed by using diamond slurry which has a size of a diameter of 2 μm is applied. As illustrated in FIG. 8, an unevenness of 500 nm or higher is formed even by using a fixed abrasive grain.

It can be recognized based on the above results that machining the surface of a ScAlMgO$_4$ substrate to be a smooth surface which does not include an unevenness of 500 nm or higher is not possible by the conventional machining method. This means the following. That is, even though an unevenness occurring by cleaving is removed, if the proportion of an occupying flat surface to the entirety is large, machining load is easily concentrated on an area portion (unevenness) when the flat surface is machined. Thus, cracks by cleaving occur not on a surface, but in the inside deeper from the surface. Thus, it is considered that the cracked portion is removed, and thus a new unevenness is formed. In a case where the proportion of the flat surface is high, an unevenness formed in the cleaving process may be hardly removed only by applying a load which has an extent that cleaving does hot occur in the inside thereof.

In the disclosure, considering features of a ScAlMgO$_4$ material, a machining method (unevenness forming process and cleavage surface forming process) as will be described below is employed. Specifically, an unevenness shape having a constant height is formed in the entirety of a region functioning as an epitaxially-grown surface of a ScAlMgO$_4$ substrate (unevenness forming process). Then, a pressing force in polishing is reduced in stages, and thus an absolute amount of variation of the pressing force in polishing is reduced. Accordingly, while cleaving the inside of the surface is prevented, an unevenness shape which has been formed in the unevenness forming process and has a constant height is gradually reduced, and thus a plurality of cleavage surfaces which are separated from each other is formed (cleavage surface forming process).

That is, in the manufacturing method according to the disclosure, at least a process (cleaving process) of preparing a ScAlMgO$_4$ plate obtained by cleaving ScAlMgO$_4$ single crystal in the (0001) plane, a process (unevenness forming process) of forming an unevenness of 500 nm or higher on the ScAlMgO$_4$ plate, and a process (cleavage surface forming process) of polishing the unevenness of 500 nm or higher to form a plurality of cleavage surfaces (unevenness lower that 500 nm) which are regularly distributed and are separated from each other, are performed.

In the disclosure, in the unevenness forming process, the unevenness shape is distributed in the entirety of an epitaxially-grown surface, such that any area of regions (also referred to as "a flat portion" below) is set to be equal to or smaller than 1 mm$^2$. The flat portion is provided in a region functioning as the epitaxially-grown surface after the unevenness forming process, and, in the flat portion, the height of the continuous unevenness is equal to or less than 500 nm. The reason is as follows. If the flat portion having an area larger than 1 mm$^2$ is formed in the unevenness forming process, cleaving occurs in the inside thereof by concentration of machining load, in the cleavage surface forming process, and thus an unevenness having a height which is more than 500 nm is formed. It is preferable that a difference in height between a plurality of protrusions of the unevenness formed in the unevenness forming process converges within a range of ±0.5 μm. An unevenness having a constant height which has variation within this range is formed on the entire surface, and thus it is possible to gradually reduce the height of as unevenness by the cleavage surface forming process, and to form a plurality of cleavage surfaces which are separated from each other, in a region functioning as an epitaxially-grown surface.

Specifically, in the unevenness forming process, an unevenness of 500 nm or higher is formed by using a first abrasive grain. In the cleavage surface forming process, an unevenness (plurality of cleavage surfaces) which is lower than 500 nm is formed by using a second abrasive grain having hardness which is smaller than that of the first abrasive grain.

Figure 9:
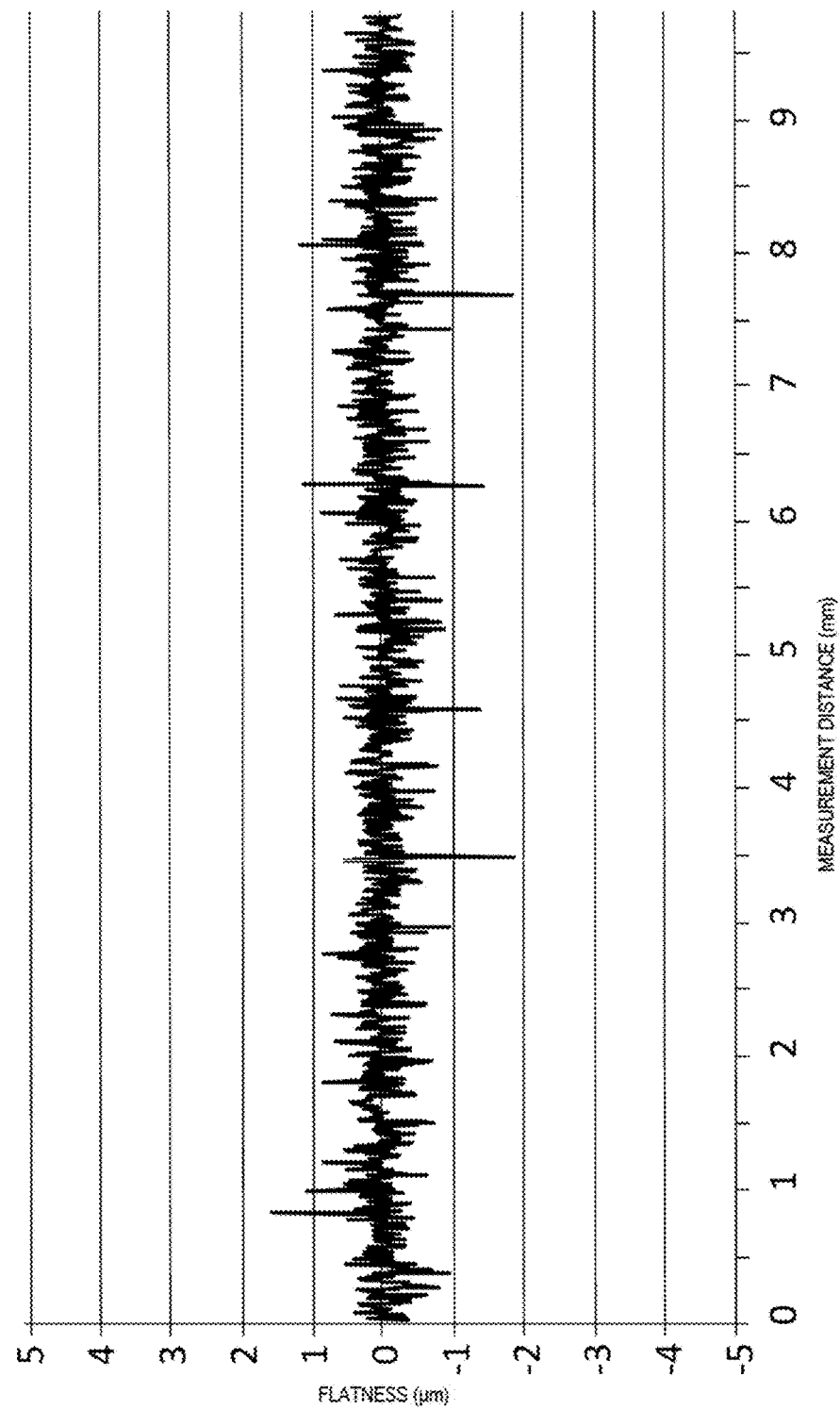
FIG. 9 is a diagram illustrating a result obtained by measuring flatness after grinding by an unevenness forming process is performed in the embodiment of the disclosure.

More detailed, in the unevenness forming process of machining an unevenness shape having a constant height, grinding is performed by using a diamond-fixed abrasive grain having a large abrasive grain size. As the abrasive grain, an abrasive diamond grain of #300 to #20000 (preferably #600) is used. According to machining using an abrasive diamond grain which has a size in this range, the difference in height of an unevenness on a surface subjected to machining converges in a range of ±5 μm. Machining conditions in the unevenness forming process are preferably as follows. The number of rotations of a whetstone is set to be 500 min$^{-1}$ to 50000 min$^{-1}$ (preferably, 1800 min$^{-1}$, the number of rotations of a ScAlMgO$_4$ substrate is set to be 10 min$^{-1}$ to 300 min$^{-1}$ (preferably, 100 min$^{-1}$), the machining speed is set to be 0.01 μm/second to 1 μm/second (preferably, 0.3 μm/second), and the machining and removing amount is set to be 1 μm to 300 μm (preferably, 20 μm). FIG. 9 illustrates a result obtained by measuring flatness of a section shape when machining is performed by using an abrasive diamond grain of #600 under conditions that the number of rotations of a whetstone is 1800 min$^{-1}$, the number of rotations of a ScAlMgO$_4$ substrate is 100 min$^{-1}$, the machining speed is 0.3 μm/second, and the machining and removing: amount is 20 μm. FIG. 9 illustrates a result obtained in a manner that flatness of a surface subjected to machining, in the X direction is measured by using a method similar to the above descriptions. As illustrated in FIG. 9, if the unevenness forming process is performed, it is possible to form a regular unevenness shape, without forming a flat portion of 1 mm$^2$ or larger (site in which the area of a continuous region in which the height of an unevenness is equal to or less than 500 nm is equal to or larger than 1 mm$^2$) in a region functioning as an epitaxially-grown surface.

Next, a process of gradually removing an unevenness formed in the unevenness forming process will be described. Polishing is performed with a pressing force which becomes weaker in stages, and thus it is possible to form an unevenness having a height which is less than 500 nm, while the unevenness which has been formed in the above-described unevenness forming process and has a height of 500 nm or more is removed. Here, the unevenness having a height of 500 nm or more may be removed. The removal may be performed by using slurry in which colloidal silica is contained as the main component, as an abrasive grain, and by using a non-woven fabric pad as a polishing pad. In addition, the removal may be performed under conditions that the number of rotations is 10 min$^{-1}$ to 1000 min$^{-1}$ (preferably, 60 min$^{-1}$), and the amount of supplied slurry is 0.02 ml/minute to 2 ml/minute (preferably, 0.5 ml/minute). Because it is easy that a machining force is selectively concentrated at protrusions in a case where many unevennesses are provided, it is preferable that the pressing force is initially set to be in a range of 10000 Pa to 20000 Pa, is set to be in a range of 5000 Pa or more and less than 10000 Pa while the protrusions become flat, and the range of the pressing force is finally set to be less than 5000 Pa. As described above, the pressing force is reduced in stages, and thus it is possible to remove an unevenness having a height of 500 nm or more, from a region functioning as an epitaxially-grown surface, without an occurrence of cleaving in the inside. At this time, if the final pressing force is set to be equal to or more than 1000 Pa and less than 5000 Pa, only a single cleavage surface is easily formed on the epitaxially-grown surface.

Figure 10:
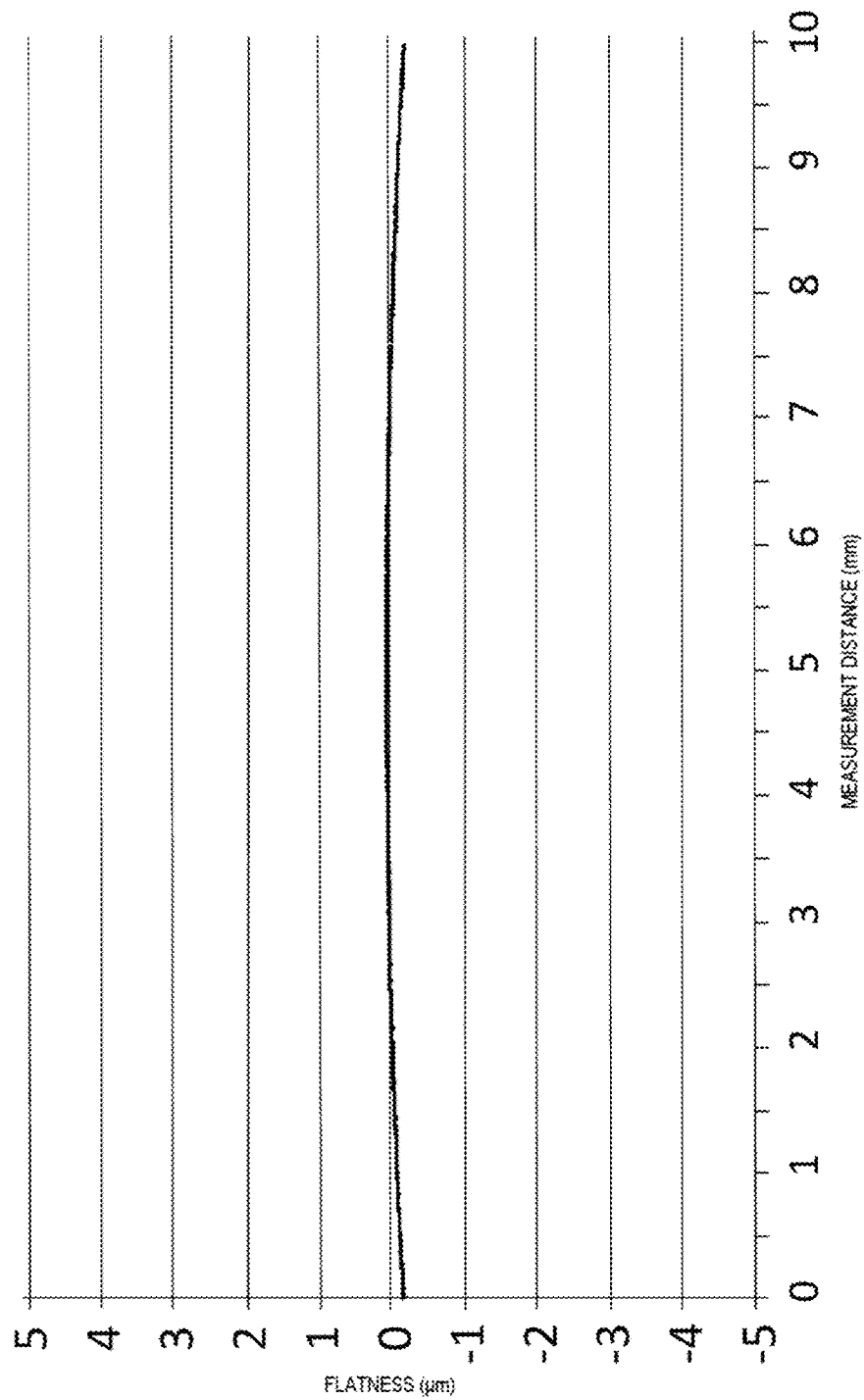
FIG. 10 is a diagram illustrating a result obtained by measuring flatness after a cleavage surface tensing process in the embodiment of the disclosure.
Figure 11:
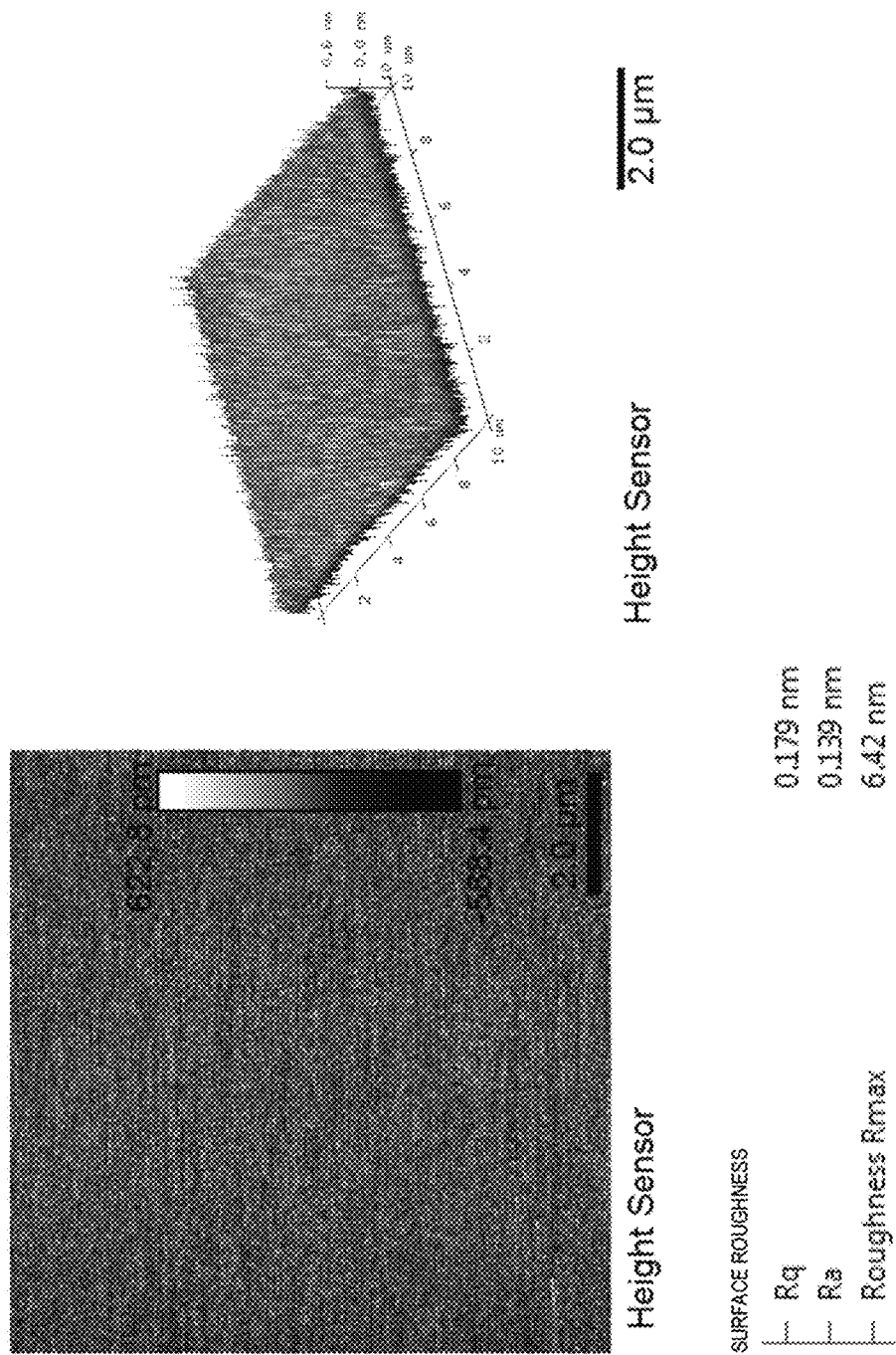
FIG. 11 is a diagram illustrating a result obtained by performing AFM measurement of a $ScAlMgO_4$ substrate having a single cleavage surface in the disclosure.

For the first time, polishing is performed at 15000 Pa for three minutes. Next, the pressing force is reduced up to 8000 Pa, and polishing is performed at 8000 Pa for five minutes. Finally, the pressing force is reduced up to 1000 Pa, and polishing is performed at 1000 Pa for 10 minutes. FIG. 10 illustrates results obtained by the above described process. FIG. 10 illustrates a surface shape measurement result obtained in a manner that flatness of an epitaxially-grown surface after machining, in the X direction is measured by using a method similar to the above descriptions. FIG. 11 illustrates a surface shape measurement result obtained in a manner that a range of 10 μm angle of the epitaxially-grown surface is measured by an AFM (atomic force microscope). As illustrated in FIG. 11, an unevenness of 500 nm or higher is not provided in the range of 10 μm angle, and an unevenness of 50 nm or higher, in which Rmax indicating the maximum height is 6.42 nm is not observed. Rq is 0.179 nm. More detailed, it is understood that it is possible to form a very smooth surface in which surface roughness Ra in a small region of 100 μm$^2$ is 0.139 nm, and an unevenness of 50 nm or higher is not provided, based on FIG. 11 obtained by detailed shape analysis. The surface roughness Ra is 0.08 nm to 0.5 nm in the region of 100 μm$^2$ in the ScAlMgO$_4$ substrate formed by the above-described method. The surface roughness Ra is a value which is measured based on ISO13565-1 by using Dimension Icon manufactured by BRUKER Corporation.

In this manner, obtaining a smooth surface in which an unevenness formed by cleaving is not provided may be realized by a process as follows. Machining (unevenness forming process) is performed to cause a smooth surface formed by cleaving to have an unevenness shape with intention and regularity. Then, the unevenness is removed little by little by machining in which cleaving does not occur. That is, according to the disclosure, a ScAlMgO$_4$ substrate having an epitaxially-grown surface in which the height of an unevenness is less than 500 nm, additionally, the height of an unevenness is equal to or less than 50 nm is obtained. Realizing the ScAlMgO$_4$ substrate is not possible by the conventional method. The surface roughness Ra in the range of 10 μm angle (100 μm$^2$) on the surface of the substrate obtained by the above method is 0.08 nm to 0.5 nm. For example, in a case where an LED light emission layer is formed on the epitaxially-grown surface of this substrate, a problem in that the above-described composition varies, light emission unevenness occurs in an LED element by the variation of the composition, or brightness is degraded does not occur. Further, the height of an unevenness is equal to or less than 50 nm, and thus an occurrence of formation poorness (for example, residue by etching a step portion) by the unevenness is suppressed, for example, when an electrode is formed after an LED light emission layer has been formed on an epitaxially-grown surface. Accordingly, manufacturing yield of a device such as an LED, which is manufactured by using this substrate is improved.

Here, a single (0001) plane (cleavage surface) as described above may be formed on the epitaxially-grown surface of a ScAlMgO$_4$ substrate. However, if a portion such as a defect or a foreign substance, which functions as a seed for accidental crystal growth is provided in the epitaxially-grown surface, when vapor phase growth of GaN is performed on the epitaxially-grown surface by, for example, a MOCVD method, Ga atoms may be concentrated on the seed for accidental crystal growth, and locally-ununiform growth may occur. Thus, in the disclosure, in order to prevent an occurrence of such a case, it is preferable that the above-described machining is performed so as to cause epitaxially-grown surface to have a plurality of cleavage surfaces which are separated from each other by steps, and are regularly distributed.

Advantages of a case where the plurality of cleavage surfaces which are regularly distributed is provided in the epitaxially-grown surface will be described below. In a case where vapor phase growth of GaN is performed on a ScAlMgO$_4$ substrate fey a MOCVD method, the Ga raw material moves (migrates) in the (0001) plane which is a cleavage surface of the epitaxially-grown surface, in a state where a portion of the Ga raw material is bonded to a methyl group. If the position of the Ga raw material is a stable position, the Ga raw material stops at this position. A bond with a methyl group is cut off), and the Ga raw material is bonded to N, and thus epitaxial growth is performed. Accordingly, the plurality of cleavage surfaces is formed on the epitaxially-grown surface, and step portions of cleavage surfaces which are adjacent to each other are caused to have stable positions, and are utilized. Thus, epitaxial growth is stabilized. The plurality of cleavage surfaces is formed to have regularity, and thus there is an advantage in that growth is regularly performed when epitaxial growth is performed on the epitaxially-grown surface by a MOCVD method.

Figure 12A:
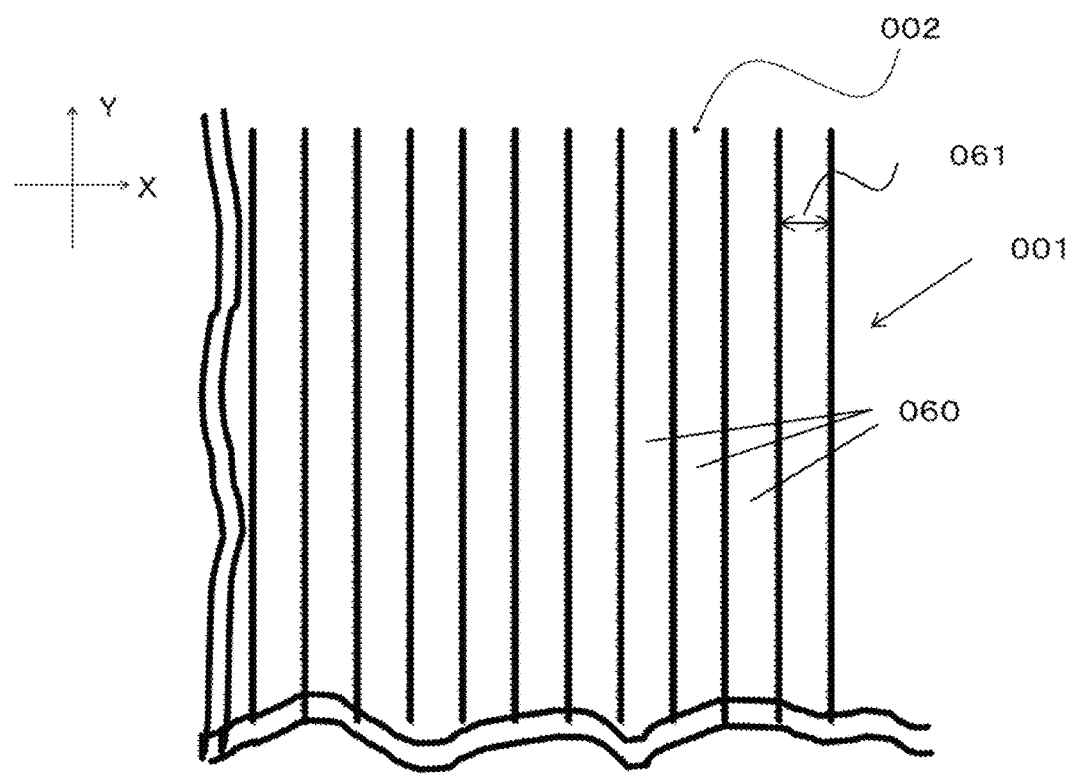
FIG. 12A is a plan view illustrating an epitaxially-grown surface of a $ScAlMgO_4$ substrate according to the embodiment, which includes a plurality of cleavage surfaces.
Figure 12B:
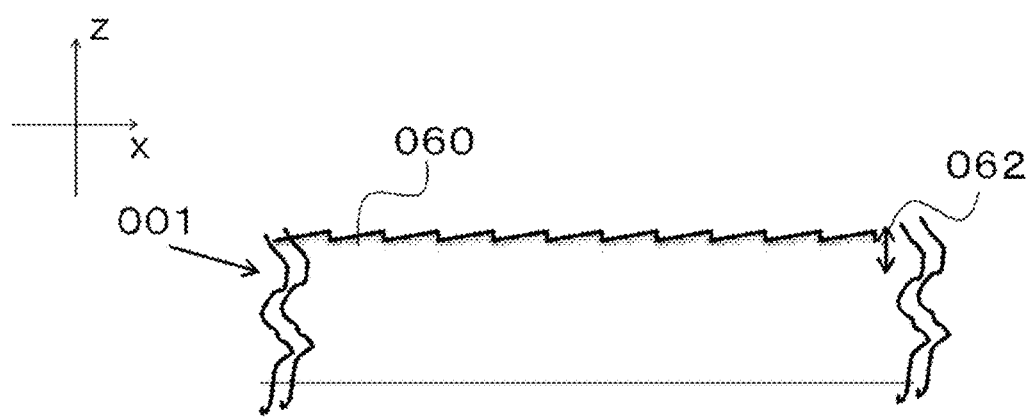
FIG. 12B is a side view illustrating the $ScAlMgO_4$ substrate.

FIG. 12A illustrates a plan view of ScAlMgO$_4$ substrate 001 including epitaxially-grown surface 002 which includes a plurality of cleavage surfaces 060. FIG. 12B illustrates a side view of ScAlMgO$_4$ substrate 001. As illustrated in FIG. 12A, it is preferable that cleavage surface 060 has a long shape, and a plurality of cleavage surfaces is regularly formed in parallel to epitaxially-grown surface 002. The width of cleavage surface 060 in the X direction corresponds to cleavage surface width 061, and the step height between adjacent cleavage surfaces corresponds to height 062 between cleavage surfaces.

Here, cleavage, surface width 061 is preferably set to move a Ga raw material to the step portion of the cleavage surface, which is a stable position, when epitaxial growth is performed by a MOCVD method. Specifically, in a case where epitaxial growth of GaN crystal is performed by a MOCVD method, if the cleavage surface width is set to be in a range of 1.5 nm to 500 nm, it is possible to form a uniform epitaxial film on the entirety of the epitaxially-grown surface. The reason is as follows. If the cleavage surface width is less than 1.5 nm, a stable position of the Ga raw material when epitaxial growth is performed is significantly close to the molecule size of the raw material molecule. Thus, realizing step flow growth (growth mode in which epitaxial growth proceeds from each step portion in a horizontal direction, and a uniform epitaxial film is obtained) in which a uniform epitaxial film is obtained may be not possible. If the cleavage surface width is equal to or more than 500 nm, the cleavage surface width is much larger than a migration distance of the Ga raw material by a MOCVD method on a GaN surface (distance obtained by Ga raw material molecules moving on the epitaxially-grown surface from when the Ga raw material molecules adhere to the epitaxially-grown surface, until the Ga raw material molecules react with $NH_3$ molecules which are an N raw material, and GaN is obtained). Thus, similarly, realizing step flow growth is not possible. Furthermore, if the cleavage surface width is set to be in a range of 5 nm to 156 nm, it is possible to form an epitaxial film in which variation of a crystal orientation is uniformly small and impurity concentration is uniformly appropriate on the entirety of the epitaxially-grown surface. The reason is as follows. In a case where the cleavage surface width is set to be in a range of 5 nm to 150 nm, the cleavage surface width coincides with the migration distance of the Ga raw material by a MOCVD method on the GaN surface. Thus, most of Ga raw material molecules adhering to the surface migrates to the step portion of the cleavage surface. Thus, step flow growth proceeds well on the entirety of the epitaxially-grown surface of the $ScAlMgO_4$ substrate, a crystal orientation of a base is maintained, and a uniform epitaxial film is grown.

Figure 13:
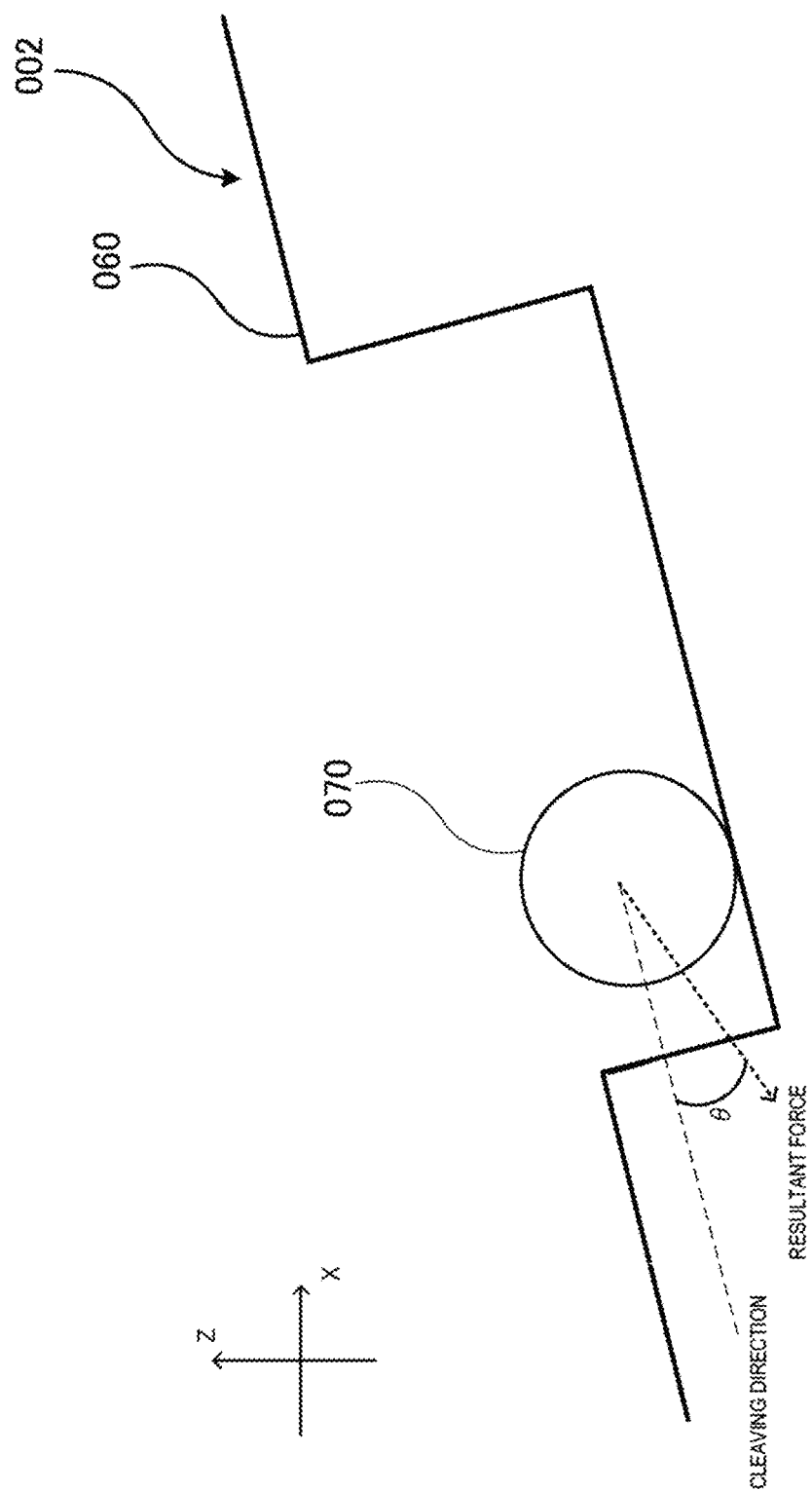
FIG. 13 is a diagram illustrating a force applied when an epitaxially-grown surface is formed.

In the disclosure, a method (cleavage surface forming process) of performing machining to set the cleavage surface width 061 to be 1.5 nm to 500 nm will be described. FIG. 13 illustrates a diagram of a machining status in a case where a surface formed from a plurality of cleavage surfaces is subjected to machining. FIG. 13 is a sectional view of epitaxially-grown surface 002 in the X direction. An orientation of a force applied when machining with abrasive grain 070 is performed is an orientation of a resultant force formed from a resultant vector of a force for moving abrasive grain 070 in the X direction, and a force for moving abrasive grain 070 in a Z direction. In this case, an angle is formed between an abrasive grain moving direction, and the cleavage surface. In a case of being viewed from the entirety of epitaxially-grown surface 002, regarding a vector of a force applied to abrasive grain 070, a machining status varies depending on the size of an inclination angle. For example, machining is easily performed in a certain direction, and performing machining is difficult in a certain direction. Thus, in order not to from an unevenness on each of cleavage surfaces 060, it is necessary that the pressing force is set considering a state where an opening angle θ between a cleaving direction in which performing machining is most difficult, and a vector direction of a force applied to the abrasive grain is large. Accordingly, it is necessary that final machining is performed in a state of pressure lower than that in a case where the cleavage surface is not divided into plural pieces. Specifically, in the process of gradually removing the above unevenness, the final range of the pressing force is set to be a range of 20 Pa to 3000 Pa, and thus it is possible to form a plurality of cleavage surfaces.

That is, in the process of gradually removing the above-described unevenness, the plurality of cleavage surfaces is formed by using slurry in which colloidal silica is contained as the main component and by using a polishing pad formed from a non-woven fabric pad. The formation is performed under conditions that the number of rotations of the polishing pad is set to be 10 $min^{-1}$ to 1000 $min^{-1}$, the amount of supplied slurry is set to be 0.02 ml/minute to 2 ml/minute, and the pressing force is set to be 1000 Pa to 20000 Pa. More detailed, in the process of gradually removing the above-described unevenness, the plurality of cleavage surfaces is formed at a pressing force which is sequentially weakened, that is, which is weakened in an order of a range of 10000 Pa to 20000 Pa, a range of 5000 Pa or more and less than 10000 Pa, and a range of 20 Pa to 3000 Pa.

FIG. 14 illustrates a result, obtained by performing polishing at the final pressing force decreased up to 200 Pa, for 10 minutes, in the process of gradually removing the above-described unevenness. Conditions other than the final pressing condition are the same as conditions when the above-described $ScAlMgO_4$ substrate illustrated in FIG. 11 is obtained. FIG. 14 illustrates a surface shape measurement result obtained by performing measurement with an AFM in a range of 10 μm angle (100 $μm^2$). As illustrated in FIG. 14, it is understood that the epitaxially-grown surface 002 is formed of plurality of long cleavage surfaces.

Here, the final pressing force when the cleavage surface width 061 is set to be 1.5 nm to 500 nm is set to be in a range of 20 Pa to 3000 Pa. However, in a case where the cleavage surface width 061 is set to be 5 nm to 150 nm, an opening angle θ between a resultant vector of the pressing force applied to the abrasive grain and a cleaving direction is reduced. Thus, the final pressing force may be set to be in a range of 100 Pa to 2800 Pa. That is, in a case where cleavage surface width 061 is set to be 5 nm to 150 nm, formation is performed in a manner that pressing force is weakened in an order of a range of 10000 Pa to 20000 Pa, a range of 5000 Pa or more and less than 10000 Pa, and a range of 100 Pa to 2800 Pa, while machining proceeds.

Figure 15:
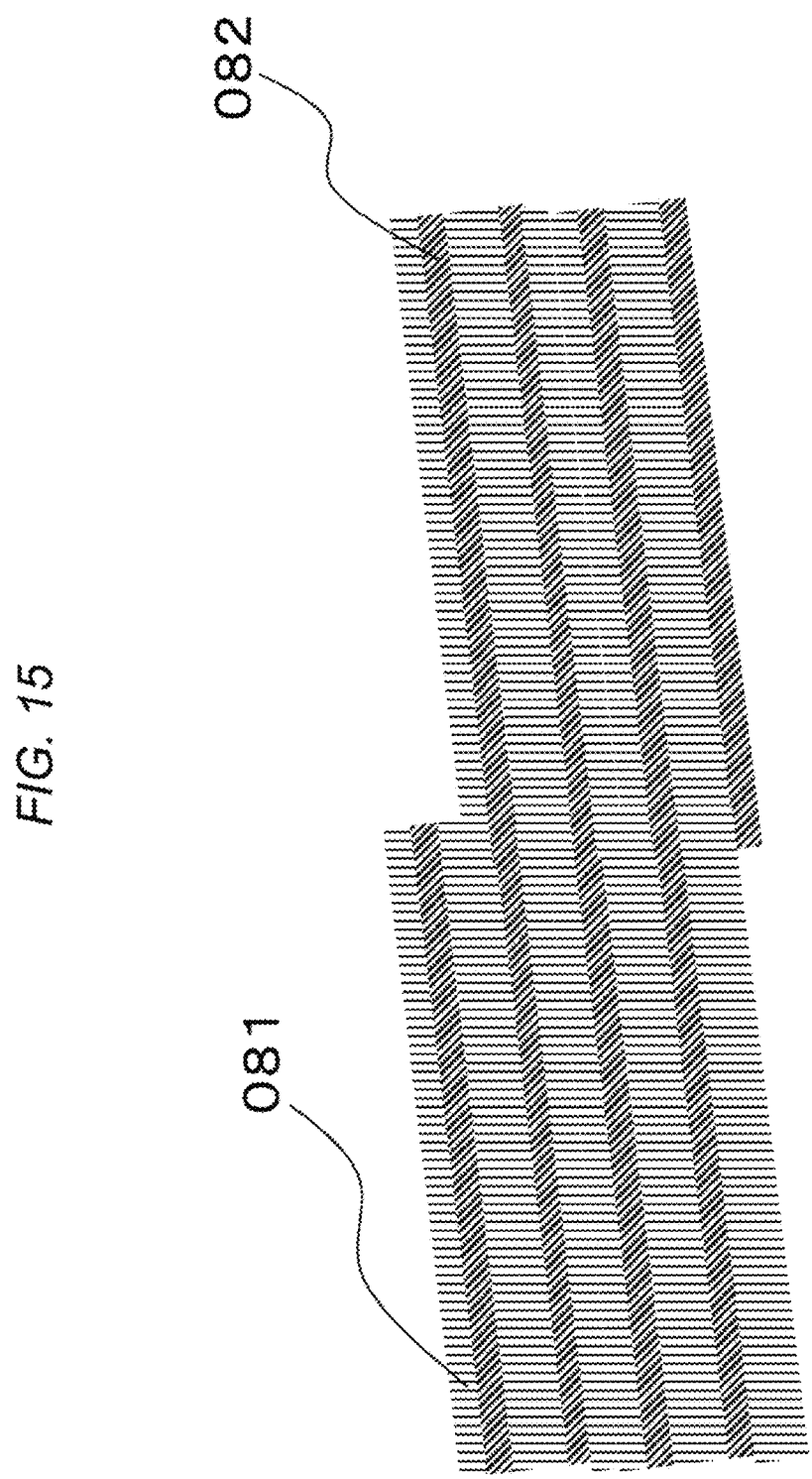
FIG. 15 is an enlarged view illustrating a section of two adjacent cleavage surfaces in an X-direction.

Here, height 062 between cleavage surfaces will be described. FIG. 15 illustrates an enlarged view of a section of two adjacent cleavage surfaces in the X direction. In FIG. 15, in a $ScAlMgO_4$ substrate formed from $MgAlO_2$ atomic layer 081 and $ScO_2$ atomic layer 082, $ScO_2$ atomic layer 082 is one layer, but $MgAlO_2$ layer 081 is obtained by stacking two layers. A portion between the layers in $MgAlO_2$ layer 081 functions as the cleavage surface. Thus, the outermost surface is formed by one layer of $MgAlO_2$ layer 081. Regarding height 062 between the cleavage surfaces, the thickness of $MgAlO_2$ atomic layer 081 corresponding to two layers, and $ScO_2$ atomic layer 082 corresponding to one layer is used as the minimum unit, in accordance with features of a cleavage portion considered from atomic arrangement of $ScAlMgO_4$. That is, the above-described thickness is set to be the minimum unit of height 062 between the cleavage surfaces in FIG. 11, and specifically, is about 0.8 nm.

In addition, in a case where epitaxial growth of GaN crystal is performed by using a MOCVD method, the height between cleavage surfaces is desirably equal to or less than a constant height, in order to suppress epitaxial growth from a wall surface of the step portion. The wall surface of the step portion, has a crystal orientation different from that of the cleavage surface. Accordingly, crystal which is epitaxially grown on the wall surface may cause problems in that impurity concentration is different or yield of epitaxial growth is reduced because this crystal is a cause of generation of polycrystal, in comparison to crystal which is epitaxially grown on the cleavage surface. Specifically, if the height between cleavage surfaces is set to be in a range of one time to ten times the minimum unit, generation of polycrystal is suppressed, and yield of epitaxial growth is improved. That is, height 062 between cleavage surfaces is preferably set to be 0.8 nm to 8 nm. In order to form height 062 between cleavage surfaces so as to be 0.8 nm to 8 nm, machining and forming is performed such that an epitaxially-grown surface as a result of performing machining at the final pressing force is measured in a range of 100 µm$^2$ by using an AFM, and as a result, the surface roughness Ra is 0.08 nm to 1.5 nm.

In addition, if the height between cleavage surfaces is set to be in a range of one time to four times the minimum unit, an epitaxial film in which impurity concentration is uniform in the entirety of an epitaxially-grown surface in addition to suppression of generating polycrystal is obtained well. That is, height 062 between cleavage surfaces is preferably set to be 0.8 nm to 3.2 nm. In order to form height 062 between cleavage surfaces so as to be 0.8 nm to 3.2 nm, machining and forming is performed such that an epitaxially-grown surface as a result of performing machining at the final pressing force is measured in a range of 100 µm$^2$ by using an AFM, and as a result, the surface roughness Ra is 0.08 nm to 1.0 nm.

Here, details of the method will be collectively described. In the unevenness forming process, the unevenness of 500 nm or higher is formed by using a whetstone to which abrasive diamond grains of #300 to #2000 are attached. The unevenness is formed under the following machining conditions. The number of rotations of the whetstone is set to be 500 min$^{-1}$ to 50000 min$^{-1}$. The number of rotations of the ScAlMgO$_4$ plate is set to be 10 min$^{-1}$ to 300 min$^{-1}$. The machining speed is set to be 0.01 µm/second to 1 µm/second. The machining and removing amount is set to be 1 µm to 300 µm. In the cleavage surface forming process, the plurality of cleavage surfaces (unevenness which is lower than 500 nm) is formed by using slurry in which colloidal silica is contained as the main component and by using a polishing pad formed from a non-woven fabric pad. The formation is performed under the following machining conditions. The number of rotations of the polishing pad is set to be 10 min$^{-1}$ to 1000 min$^{-1}$. The amount of supplied slurry is set to be 0.02 ml/minute to 2 ml/minute. The pressing force is set to be 20 Pa to 20000 Pa. Further, the plurality of cleavage surfaces (unevenness which is lower than 500 nm) can be precisely formed in a manner that pressing force is weakened in an order of a range of 10000 Pa to 20000 Pa, a range of 5000 Pa or more and less than 10000 Pa, and a range of 20 Pa to 3000 Pa, while machining proceeds. In a case where a single cleavage surface is formed, the final pressing force in the cleavage surface forming process is set to be 1000 Pa or more and less than 5000 Pa.

The epitaxially-grown surface may be formed only on one surface (front surface). Only one surface (front surface) is subjected to polishing, and thus it is possible to simplify the processes. In this case, the unevenness of 500 nm or higher in a state of being formed, remains itself, on the other surface (back surface). The epitaxially-grown surface may be formed on both of the surfaces. In this case, epitaxial growth of nitride semiconductor such as GaN may be performed on both of the surfaces.

Figure 16:
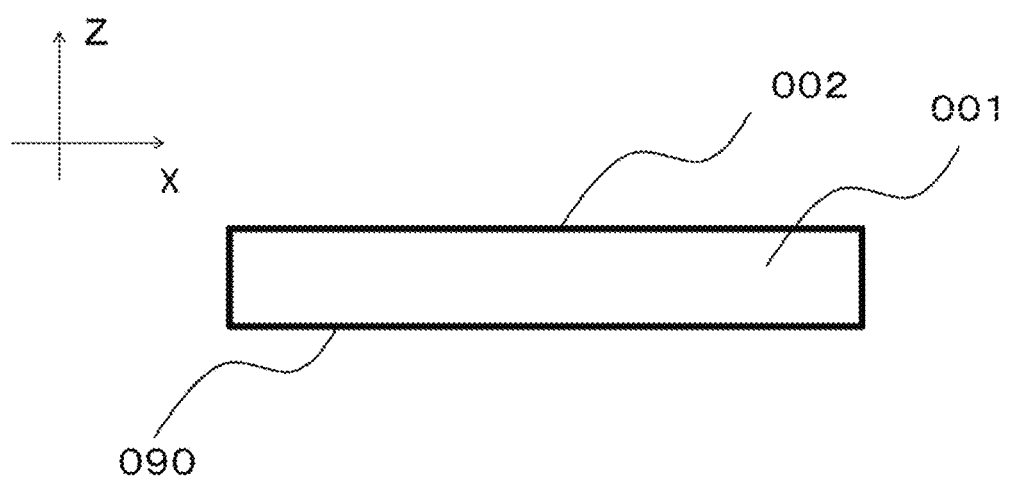
FIG. 16 is a diagram illustrating a $ScAlMgO_4$ substrate which has a satin-finish shape.
Figure 17:
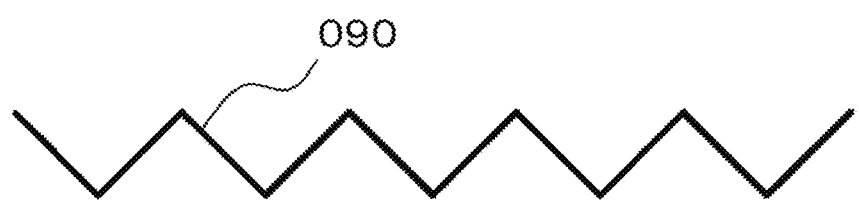
FIG. 17 is a partial enlarged view illustrating a section of the $ScAlMgO_4$ substrate which has a satin-finish shape.

In the ScAlMgO$_4$ substrate according to the disclosure, as illustrated in FIG. 16, the one surface, that is, the back surface of the epitaxially-grown surface 002 may be satin-finish shape 090. FIG. 16 illustrates ScAlMgO$_4$ substrate 001 which includes satin-finish shape 090. Satin-finish shape 090 is provided on the back surface of the ScAlMgO$_4$ substrate, and thus the front surface and the back surface of ScAlMgO$_4$ substrate 001 may be distinguished from each other. When ScAlMgO$_4$ substrate 001 is transported, satin-finish shape 090 functions as slip resistance. Thus, it is possible to suppress an occurrence of damage or defects by slipping and collision of ScAlMgO$_4$ substrate 001 during the transportation. Satin-finish shape 090 has surface roughness Ra larger than that of epitaxially-grown surface 002. Even in a case where a plurality of cleavage surfaces 060 is formed in epitaxially-grown surface 002, the surface roughness of satin-finish shape 090 is largest. Specifically, the surface roughness Ra of epitaxially-grown surface 002 formed from a single cleavage surface is generally 0.08 nm to 0.5 nm. In a case where a plurality of cleavage surfaces is provided, the surface roughness Ra of epitaxially-grown surface 002 is 0.08 nm to 1.5 nm. On the contrary, the surface roughness of satin-finish shape 090 is 500 nm to 8000 nm. The surface roughness is a value measured in a region of 100 µm$^2$. FIG. 17 illustrates an enlarged view of satin-finish shape 090.

It is preferable that the height of the unevenness shape in epitaxially-grown surface 001 is equal to or less than 500 nm, but the height of the unevenness shape in satin-finish shape 090 is equal to or more than 500 nm. The height of the unevenness is a value obtained by measurement in the above-described laser reflection type measuring device. In a case where the back surface of the epitaxially-grown surface in the ScAlMgO$_4$ substrate does not have a satin-finish shape in which the height of an unevenness is equal to or more than 500 nm, when exposure treatment for forming a pattern having a device structure or a wiring structure on the epitaxially-grown surface side is performed, since the ScAlMgO$_4$ substrate is transparent, light from the back surface may be reflected, and the reflected light may influence the exposure. In addition, the following problems may occur. That is, there is a problem in that distinguishment between the front surface and the back surface is difficult in handling, and thus confusion may occur, and a problem in that slipping may easily occur when a substrate is installed on a flat surface of a manufacturing device, such as a stage.

Satin-finish shape 090 may be formed by a machining method of forming a uniform unevenness on the front surface. Specifically, satin-finish shape 090 may be formed by grinding which uses a diamond-fixed abrasive grain having a large abrasive grain size. An abrasive diamond grain of #100 to #2000 is used as the abrasive grain. More preferably, an abrasive diamond grain of #600 is used. That is, a substrate including satin-finish shape 090 is obtained by the process of preparing a ScAlMgO$_4$ plate which is obtained by cleaving ScAlMgO$_4$ single crystal in the (0001) plane, the process of polishing one surface (front surface) of the ScAlMgO$_4$ plate so as to form an epitaxially-grown surface, the process of machining a surface (back surface) on an opposite side of the epitaxially-grown surface so as to form a satin-finish surface which has surface roughness larger than that of the epitaxially-grown surface. The satin-finish surface is formed by using a whetstone to which an abrasive diamond grain of #100 to #2000 is attached. The formation is performed under the following machining conditions. The number of rotations of the whetstone is 500 min$^{-1}$ to 50000 min$^{-1}$. The number of rotations of the ScAlMgO$_4$ plate is 10 min$^{-1}$ to 300 min$^{-1}$. The machining speed is 0.01 µm/second to 1 µm/second. The machining and removing amount is 1 µm to 300 µm. Preferably, a difference of an unevenness may be reduced by using an abrasive diamond grain of #600. Machining is performed under preferable machining conditions as follows. The number of rotations of the whetstone is 1800 min$^{-1}$. The number of rotations of the ScAlMgO$_4$ plate is 100 min$^{-1}$. The machining speed is 0.3 µm/second. The machining and removing amount is 20 µm.

In order to remove an influence of an affected layer by machining, grinding or blast machining for forming the affected layer may be performed.

Here, the epitaxially-grown surface is a surface on which another type of crystal is epitaxially grown on crystal functioning as a substrate. For example, the epitaxially-grown surface may be set to be a region on an inner side of 5 mm or more from an outer circumference of the substrate. Epitaxial growth is a growth form of crystal in which new crystal is aligned and arranged to a crystal surface of the substrate on the base. Crystal of a compound semiconductor such as a nitrogen compound of the III group may be grown on the epitaxially-grown surface by a vapor phase growth method such as a MOCVD method, a metal-organic vapor phase epitaxy (MOVPE) method, and a hydride vapor phase epitaxy (HVPE) method, or a liquid phase growth method such as a flux method.

MOCVD growth of GaN is described as a method of performing epitaxial growth on the ScAlMgO$_4$ substrate. However, in a case of growth of AlGaInN crystal obtained by adding Al or In to GaN, similar advantages are also obtained.

The growing method is also not limited to MOCVD. Other growing methods may be used together, for example, HVPE growth or a method of performing HVPE growth after MOCVD growth. Regarding the growth temperature, an AlGaInN buffer layer may be grown at a low temperature of about 500° C. to 600° C., and then growth of GaN crystal may be performed at a high temperature of 1000° C. or higher.

A light emitting device, a power device, and the like may be formed by performing hetero junction of the same AlGaInN on the AlGaInN crystal layer.

Other Embodiments

In the above-described embodiment, a substrate obtained from single crystal of ScAlMgO$_4$ is described among substrates formed from single crystal which is represented by the formula RAMO$_4$. However, the disclosure is not limited thereto.

The substrate according to the disclosure is configured by a substantially single crystal material which is represented by the formula RAMO$_4$. In the formula, R indicates one or a plurality of trivalent elements selected from Sc, In, Y, and a lanthanoid element (atomic number 67 to 71). A indicates one or a plurality of trivalent elements selected from Fe(III), Ga, and Al. M indicates one or a plurality of bivalent elements selected from Mg, Mn, Fe(II), Co, Gu, Zn, and Cd. The substantially single crystal material refers to crystalline solid, for example, which contains RAMO$_4$ constituting an epitaxially-grown surface, so as to be equal to or sore than 90 at %, and an orientation of any portion of the epitaxially-grown surface is the same when focusing on a certain crystal axis. However, a matter in which an orientation, of a crystal axis locally varies, or a matter which includes a localized lattice defect is also handled as single crystal. O indicates oxygen. As described above, it is desirable that R is set to be Sc, A is set to be Al, and M is set to be Mg.

When an LED element in which an LED light emission layer is grown on a substrate during MOCVD vapor phase growth is manufactured, a substrate according to the disclosure is used, and thus an occurrence of light emission unevenness and degradation of brightness as an LED element may be prevented.

What is claimed is:

1. A RAMO$_4$ substrate comprising a single crystal represented by a formula of RAMO$_4$, wherein:

in the formula, R indicates one or a plurality of trivalent elements selected from a group consisting of Sc, In, Y, and a lanthanoid element, A indicates one or a plurality of trivalent elements selected from a group consisting of Fe(III), Ga, and Al, and M indicates one or a plurality of bivalent elements selected from a group consisting of Mg, Mn, Fe(II), Co, Cu, Zn, and Cd, at least one surface of the RAMO$_4$ substrate-comprises a plurality of cleavage surfaces which are arranged along a first direction, and are separated from each other by steps, each of the cleavage surfaces has a rectangular shape having a longitudinal side in a second direction crossing the first direction and a widthwise side, and a width of the widthwise side of each of the cleavage surfaces is at least 1.5 nm and no greater than 500 nm.

2. The RAMO$_4$ substrate of claim 1, wherein
a width of the widthwise side of each of the cleavage surfaces is at least 5 nm and no greater than 150 nm.

3. The RAMO$_4$ substrate of claim 1, wherein
the cleavage surfaces which are adjacent to each other are separated at an interval of at least 0.8 nm and no greater than 8 nm.

4. The RAMO$_4$ substrate of claim 1, wherein
in the formula, R indicates Sc, A indicates Al, and M indicates Mg.

5. The RAMO$_4$ substrate of claim 1, wherein
the cleavage surfaces are regularly arranged along the first direction.

6. A RAMO$_4$ substrate comprising a single crystal represented by a formula of RAMO$_4$, wherein:

in the formula, R indicates one or a plurality of trivalent elements selected from a group consisting of Sc, In, Y, and a lanthanoid element, A indicates one or a plurality of trivalent elements selected from a group consisting of Fe(III), Ga, and Al, and M indicates one or a plurality of bivalent elements selected from a group consisting of Mg, Mn, Fe(II), Co, Cu, Zn, and Cd, at least one surface of the RAMO$_4$ substrate-comprises a plurality of cleavage surfaces which are arranged along a first direction, and are separated from each other by steps, and surface roughness Ra in a region of 100 μm$^2$ on the at least one surface is at least 0.08 nm and no greater than 1.5 nm.

7. The RAMO$_4$ substrate of claim 6, wherein
the cleavage surfaces are regularly arranged along the first direction.

8. The RAMO$_4$ substrate of claim 6, wherein
in the formula, R indicates Sc, A indicates Al, and M indicates Mg.

9. A RAMO$_4$ substrate comprising a single crystal represented by a formula of RAMO$_4$, wherein:

in the formula, R indicates one or a plurality of trivalent elements selected from a group consisting of Sc, In, Y, and a lanthanoid element, A indicates one or a plurality of trivalent elements selected from a group consisting of Fe(III), Ga, and Al, and M indicates one or a plurality of bivalent elements selected from a group consisting of Mg, Mn, Fe(II), Co, Cu, Zn, and Cd, at least one surface of the RAMO$_4$ substrate-comprises a plurality of cleavage surfaces which are arranged along a first direction, and are separated from each other by steps, in the formula, R indicates Sc, A indicates Al, and M indicates Mg, and an AlMgO$_2$ layer is exposed between adjacent cleavage surfaces.

10. The RAMO$_4$ substrate of claim 9, wherein the cleavage surfaces are regularly arranged along the first direction.

\* \* \* \* \*